United States Patent [19]

Kwon et al.

[11] Patent Number: 5,976,908
[45] Date of Patent: Nov. 2, 1999

[54] METHOD OF FABRICATING SOLID-STATE IMAGE SENSOR

[75] Inventors: Kyoung Kuk Kwon, Seoul; Jong Hoa Kim, Kyungki-do, both of Rep. of Korea

[73] Assignee: LG Semicon Co., Ltd., Chungcheongbuk-Do, Rep. of Korea

[21] Appl. No.: 09/037,698

[22] Filed: Mar. 10, 1998

[30] Foreign Application Priority Data

Jun. 13, 1997 [KR] Rep. of Korea ................ 97-24547

[51] Int. Cl.$^6$ ................ H01L 21/3205; H01L 21/33; H01L 21/339
[52] U.S. Cl. ................ 438/69; 257/249
[58] Field of Search ................ 257/187, 192, 257/222, 223, 225, 229, 230, 249; 438/60, 72, 69

[56] References Cited

U.S. PATENT DOCUMENTS 5,264,374 11/1993 Watanabe et al. ................ 438/58
5,514,888 5/1996 Sano et al. ................ 257/232

Primary Examiner—Wael M. Fahmy
Assistant Examiner—William David Coleman
Attorney, Agent, or Firm—Morgan, Lewis & Bockius LLP

[57] ABSTRACT

A method for fabricating a solid-state image sensor includes the steps of forming a well of a first conductivity type in a substrate of a second conductivity type, forming a plurality of photoelectric conversion regions in the well, forming a plurality of charge coupled devices in the photoelectric conversion regions, forming a gate insulating layer over the substrate, forming a polysilicon layer over the gate insulating layer, forming a cap insulating layer over the polysilicon layer, forming a first optical shielding metal layer over the cap insulating layer, forming a first insulating layer over the first optical shielding metal layer, patterning the polysilicon layer, cap insulating layer, the first optical shielding metal layer, and the first insulating layer to form polygates, forming sidewall spacers on sides of the cap insulating layer and the polygate, forming a second optical shielding metal layer on sides of the first optical shielding metal layer and the sidewall spacers, and removing the first insulating layer.

18 Claims, 5 Drawing Sheets

METHOD OF FABRICATING SOLID-STATE IMAGE SENSOR

This application claims the benefit of Korean Patent Application No. 24547/1997, filed Jun. 13, 1997, which is hereby incorporated by reference.

BACKGROUND OF THE INVENTION

1. Field of the Invention

The present invention relates to a method for fabricating a solid-state image sensor, and, more particularly, to a method for fabricating a solid-state image sensor using self-alignment to form an optical shielding metal (OSM) layer, thus improving its sensitivity and solving the smear problem.

2. Discussion of the Related Art

A solid-state image sensor is a device which images a subject and then outputs the imaged subject as electrical signals by using photoelectric conversion devices and charge-coupled devices (CCDs). By using potential changes in the substrate, CCDs transfer in a predetermined direction charges generated in the photoelectric conversion devices, e.g., photodiodes.

A general solid-state image sensor includes a plurality of photoelectric conversion regions, e.g. photodiodes, vertical charge coupled devices (VCCDs) formed between the photoelectric conversion regions for transferring in a vertical direction the charges generated in the photoelectric conversion regions, a horizontal charge coupled device (HCCD) for transferring in a horizontal direction the charges transferred in a vertical direction by the VCCDs, and a floating diffusion region for sensing and amplifying the charges transferred in a horizontal direction and then outputting the charges to a peripheral circuit.

A conventional solid-state image sensor will now be described with reference to the accompanying drawings.

FIG. 1 is a cross-sectional view showing a structure of a solid-state image sensor, which includes a p-type well 2 formed beneath the surface of an n-type semiconductor substrate 1. Buried charge coupled devices (BCCDs) 3 are formed in the p-type well 2 and spaced apart from one another, PD-N regions 4 are formed in the p-type well 3. Channel stop layers 5 are formed partially around the PD-N regions 4. PD-P regions 6 are formed on the PD-N regions 4. A gate insulating layer 7 is formed on the entire surface including the PD-N and PD-P regions 4 and 6 and the BCCDs 3. Polygates 8 are formed over the BCCDs 3 and above the gate insulating layer 7. An insulating layer 9 is formed to cover the polygates 8. OSM layers 10 are formed on the entire surface except over the PD-N regions 4. At this time, the BCCDs 3 stand for VCCDs.

An operation of a conventional solid-state image sensor having such a structure will now be described. Charges accumulated in photoelectric conversion regions, e.g., the PD-N regions 4 and the PD-P regions 6, which convert the image into electric signals, are transferred to BCCDs 3 by clock signals, applied to a transfer gate (not shown). Then, the charges transferred to the BCCDs 3 are transferred in a vertical direction by clock signals applied to the polygates 8. The OSM layer 10, formed on the gate insulating layer 7 and the insulating layer 9 (except over the PD-N regions 4), prevents photons from directly entering the BCCDs 3.

FIG. 2 is a cross-sectional view showing problems of the conventional solid-state image sensor. In general, the OSM layer 10 is made of a metal having a 99% reflectivity.

A process for forming an OSM layer in a conventional solid-state image sensor will now be described. First, a gate insulating layer 7 is formed on the entire surface including the photoelectric conversion regions, i.e. the PD-N and PD-P regions 4 and 6 and the BCCDs 3. Subsequently, the polygates 8 are formed on the gate insulating layer 7 and only on the BCCDs 3, and then the insulating layer 9 is formed on the entire surface of the polygates 8. Thereafter, an OSM layer 10 is formed on the insulating layer 9 and the gate insulating layer 7, except over the PD-N regions 4. To form the OSM layer 10, optical shielding metal is formed on the entire surface of the insulating layer 9 and is selectively patterned by photolithography and photo etching processes. The insulating layer 9 is selectively removed over the PD-N regions 4.

However, as the number of pixels increases in order to obtain a miniaturized device with good resolution, minimum line width is reduced, and margins for the photolithography is also reduced. Accordingly, if misalignment exists, as shown in FIG. 2, the OSM layer 10 can shift over a portion of the PD-N region 4. If so, a smear can result, where light is smeared into the CCDs (mainly into VCCDs) at one side of a light-receiving part (PD-N) where the OSM layer 10 is not formed. At this time, the smear, where carriers due to light leakage are directly transferred to adjacent CCDs, can cause a phenomenon where a trail is dragged in a vertical direction on a screen.

FIG. 3 is a cross-sectional view showing a structure of another conventional solid-state image sensor. The structure of this solid-state image sensor is similar to that of the solid-state image sensor shown in FIG. 1. The difference between these two sensors, however, is that an OSM layer 10 of FIG. 3 covers the edge portions of the PD-N region 4. The solid-state image sensor shown in FIG. 3 is designed to solve the problem generated in a solid-state image sensor shown in FIG. 2. Since the OSM layer 10 is expanded by a predetermined distance D, light is blocked from transmission through PD-N regions 4 in spite of misalignment.

However, such conventional solid-state image sensors have the following problems. First, as the number of pixels increases to obtain miniaturized devices with light weight and high resolution, process margins for photolithography decrease. Accordingly, the possibility of misalignment and smear is high, thus affecting the reliability of a solid-state image sensor.

Second, in the conventional solid-state image sensor as shown in FIG. 3, an OSM layer is formed over edges of a PD-N region in order to prevent the smear. However, total light-receiving area is decreased even though the OSM layer is precisely patterned, thereby degrading its sensitivity. If misalignment also exists, the sensitivity of the device becomes inferior, and its performance deteriorates.

SUMMARY OF THE INVENTION

Accordingly, the present invention is directed to a method of fabricating a solid-state image sensor that substantially obviates one or more of the problems due to the limitations and disadvantages of the related art.

One object of the present invention is to provide a method of fabricating a solid-state image sensor which uses self-alignment to form an OSM layer and thus improve its sensitivity and solve the problem of smear.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these an other advantages, and in accordance with the purpose of the present invention, as embodied and broadly described, in a first aspect of the present invention there is provided a method for fabricating a solid-state image sensor including the steps of forming a well of a first conductivity type in a substrate of a second conductivity type, forming a plurality of photoelectric conversion regions in the well, forming a plurality of charge coupled devices in the photoelectric conversion regions, forming a gate insulating layer over the substrate, forming a polysilicon layer over the gate insulating layer, forming a cap insulating layer over the polysilicon layer, forming a first optical shielding metal layer over the cap insulating layer, forming a first insulating layer over the first optical shielding metal layer, patterning the polysilicon layer, cap insulating layer, the first optical shielding metal layer, and the first insulating layer to form polygates, forming sidewall spacers on sides of the cap insulating layer and the polygate, forming a second optical shielding metal layer on sides of the first optical shielding metal layer and the sidewall spacers, and removing the first insulating layer.

In a second aspect of the present invention there is provided a method for fabricating a solid-state image sensor including the steps of forming a charge coupled device in the substrate, forming a gate insulating layer over the substrate, forming a polysilicon layer over the gate insulating layer, forming a cap insulating layer over the polysilicon layer, forming a first optical shielding metal layer over the cap insulating layer, forming a first insulating layer over the first optical shielding metal layer, patterning the polysilicon layer, the cap insulating layer, the first optical shielding metal layer, and the first insulating layer to form a polygate over the charge coupled device, forming a high temperature low pressure dielectric layer covering the gate insulating layer, the first insulating layer, the first optical shielding metal layer, the cap insulating layer, and the polygate, etching the high temperature low pressure dielectric layer to form sidewall spacers, forming the second optical shielding metal layer over the gate insulating layer, the sidewall spacers and the first insulating layer, patterning the second optical shielding metal layer, and removing the first insulating layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention that together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

FIGS. 4A–4I are cross-sectional views showing process steps of a method for fabricating a solid-state image sensor of the present invention.

Figure 1:
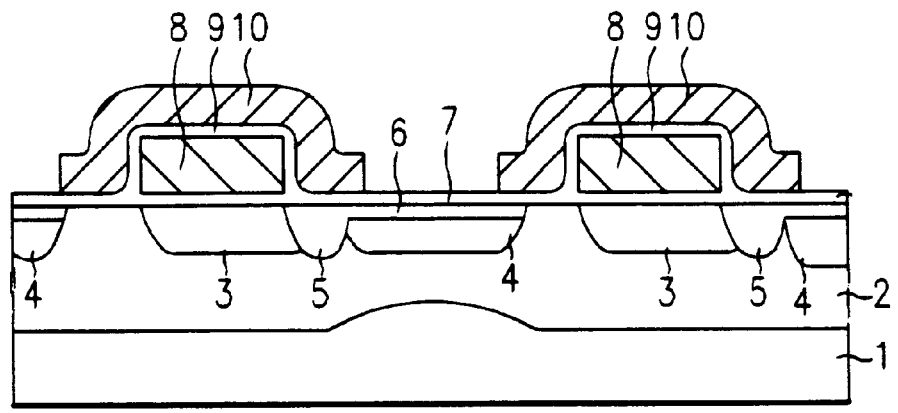
FIG. 1 is a cross-sectional view showing a structure of a conventional solid-state image sensor.
Figure 2:
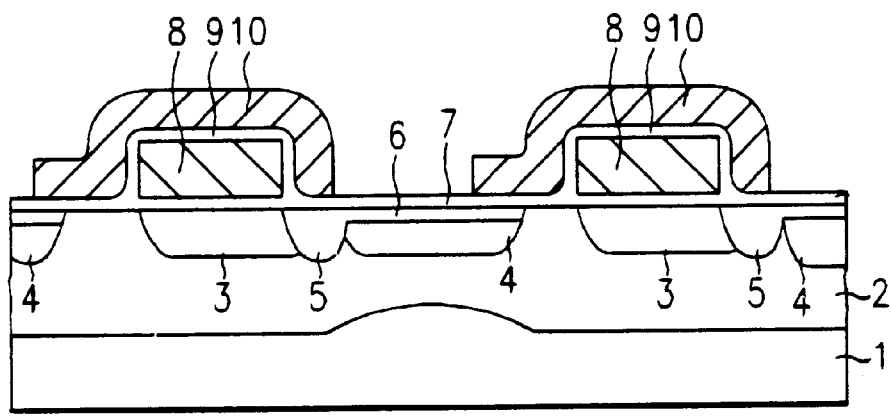
FIG. 2 is a cross-sectional view illustrating the problems of the conventional solid-state image sensor.
Figure 3:
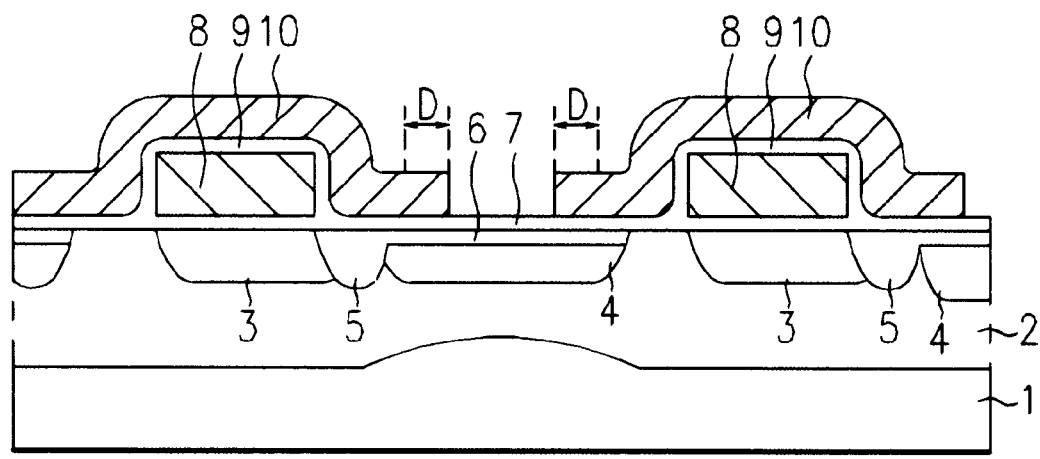
FIG. 3 is a cross-sectional view showing a structure of another conventional solid-state image sensor.
Figure 4A:
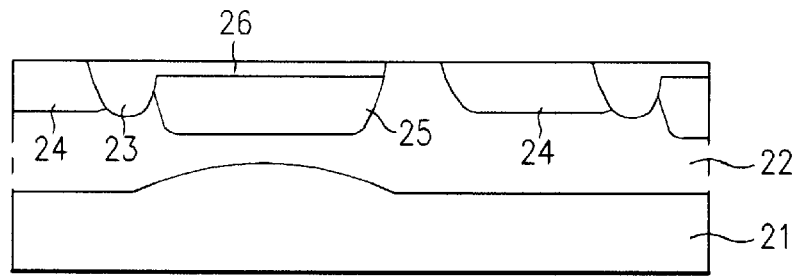
FIGS. 4A–4I are cross-sectional views showing process steps of a method for fabricating a solid-state image sensor of the present invention.

Referring initially to FIG. 4A, a p-type well 22 is formed beneath the surface of an n-type semiconductor substrate 21. Next, a plurality of channel stop layers 23 are selectively formed in the p-type well 22, spaced apart from one another by a predetermined distance. Subsequently, buried charge coupled devices (BCCDs) 24 are formed. At this time, each of the BCCDs 24 is formed at one side of each of the channel stop layers 23. Each of photoelectric conversion regions, i.e. PD-N and PD-P regions 25 and 26, is formed on the other side of each of the channel stop layers 23.

Figure 4B:
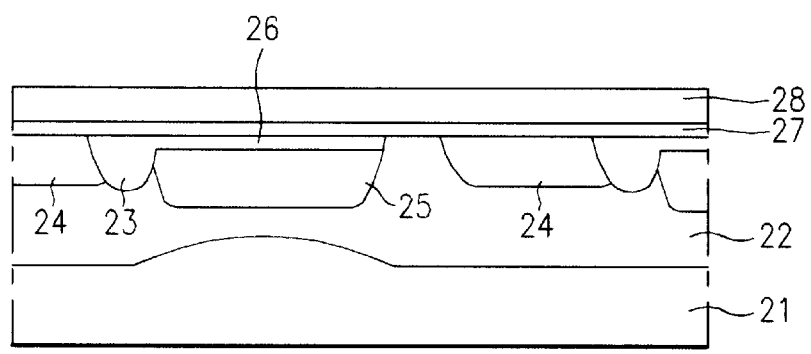

Referring to FIG. 4B, a gate insulating layer 27 and a polysilicon layer 28 are successively formed on the entire surface of the semiconductor substrate 21 including the photoelectric conversion regions 25 and 26 and the BCCDs 24.

Figure 4C:
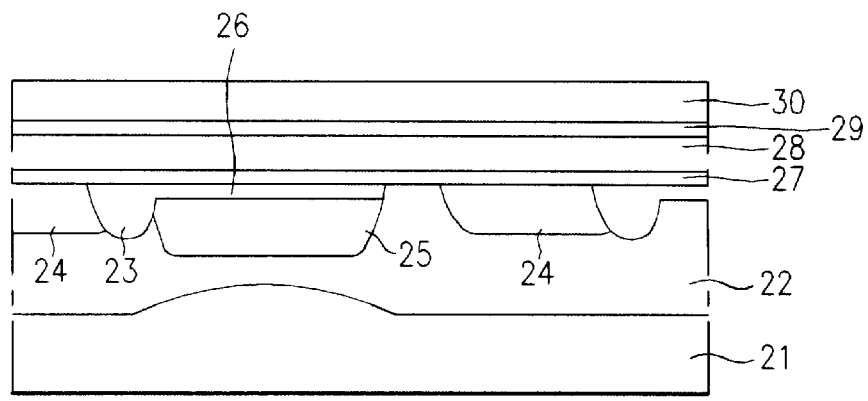

Referring to FIG. 4C, a cap insulating layer 29 and a first OSM layer 30 are successively formed on the polysilicon layer 28. At this time, the first OSM layer 30 is made of optical shielding metal (OSM) such as tungsten silicide ($WSi_x$), aluminum including tungsten (W), or tungsten titanium (TiW).

Figure 4D:
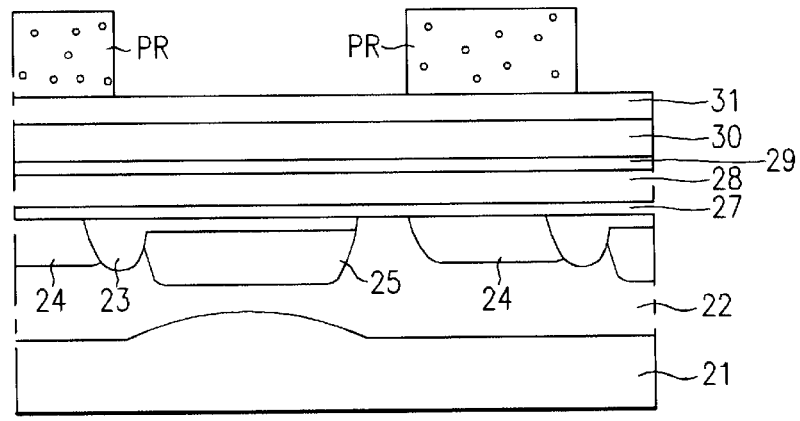

Referring to FIG. 4D, a first insulating layer 31 is formed on the first OSM layer 30Subsequently, a photoresist film PR is coated on the first insulating layer 31 and patterned with exposure and development processes, remaining only over the BCCDs 24. The first insulating layer 31 is made of either an oxide or a nitride. When the first insulating layer 31 is made of an oxide, a high temperature low pressure dielectric (HLD) is used. When the HLD is used to form the first insulating layer 31, the OSM layer 30 is made of materials excluding aluminum, because aluminum, which has a low melting point, can melt in the process of forming the first insulating layer 31 with HLD at a high temperature and under a low pressure.

Figure 4E:
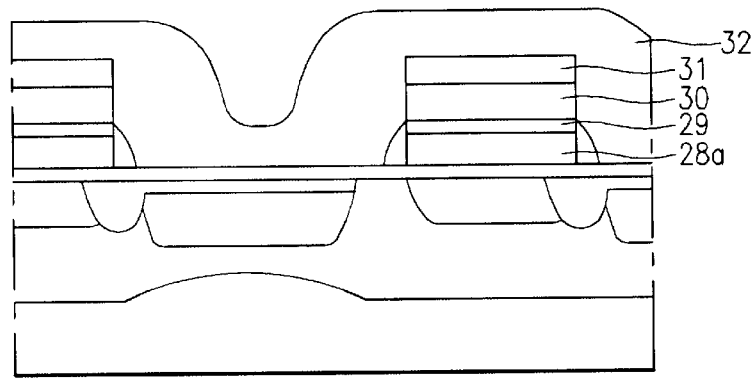

Referring to FIG. 4E, with the photoresist pattern PR serving as a mask, the first insulating layer 31, the first OSM layer 30, the cap insulating layer 29, and the polysilicon layer 28 are selectively removed to form polygates 28a. Subsequently, any remaining photoresist film is removed. Thereafter, a second insulating layer 32 is formed on the entire surface including the gate insulating layer 27, the polygates 28a, the cap insulating layer 29, the first OSM layer 30, and the first insulating layer 31. The second insulating layer 32 is made of either an oxide or a nitride. If it is made of an oxide, an HLD is used.

Figure 4F:
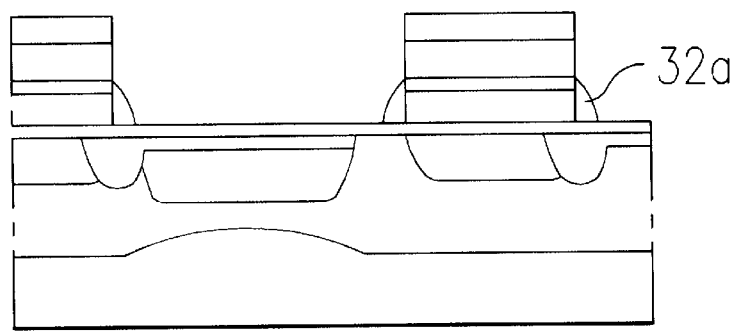

Referring to FIG. 4F, the second insulating layer 32 is etched-back to form sidewall spacers 32a on both sides of the cap insulating layer 29 and the polygate 28a. The sidewall spacers 32a can be formed by oxidizing exposed sides of the polygate 28a, rather than the process described in FIG. 4E. The sidewall spacers 32a are formed at a temperature higher than 600° C. and under a low pressure of 100–120 Pa in order to have a uniform thickness.

Figure 4G:
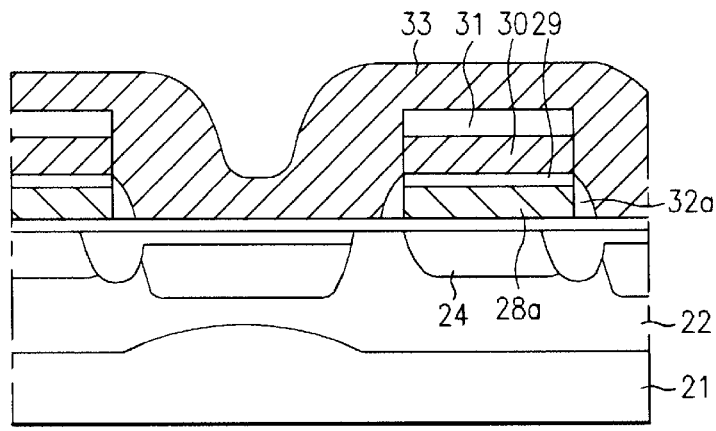

Referring to FIG. 4G, a second OSM layer 33 is formed on the entire surface of the gate insulating layer 27 including the sidewall spacers 32a and the first insulating layer 31. The OSM layer 33 is made of $WSi_x$, aluminum containing tungsten, or tungsten titanium.

Figure 4H:
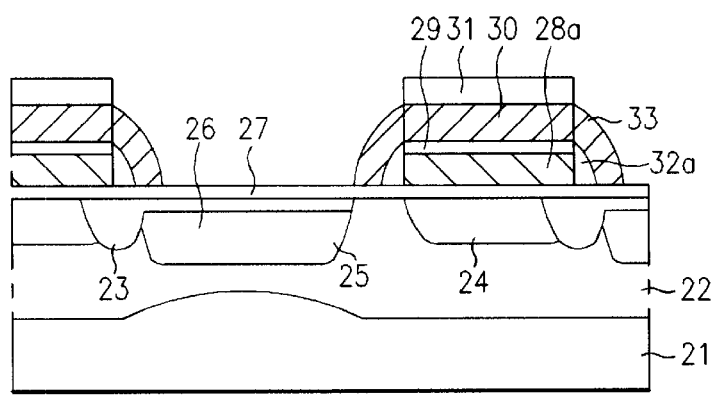

Referring to FIG. 4H, the second OSM layer 33 is etched-back or side-etched to remain on the sides of the first OSM layer 30 and the sidewall spacers 32a. In other words, a self-alignment method is used. The etch-back process is carried out until the surface of the first insulating layer 31 is exposed. Thus, with the first insulating layer 31 used as the etch-end point, the light-shielding portion can be masked exactly.

Figure 4I:
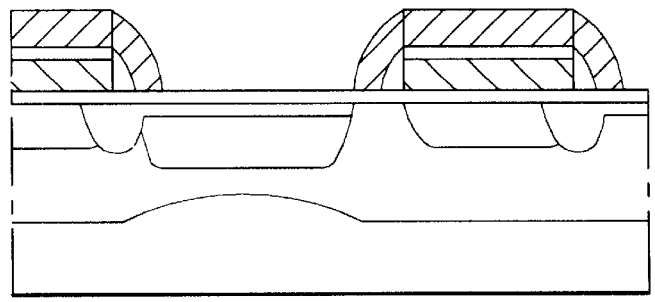

Referring finally to FIG. 4I, the first insulating layer 31 is removed.

Such a method for fabricating a solid-state image sensor of the present invention has the following advantages. Since an OSM layer expands to form on photoelectric conversion regions by self-alignment, this prevents its sensitivity from deteriorating. Thus, a method for fabricating a solid-state image sensor with high reliability can be provided.

While the invention has been described in detail and with reference to specific embodiments thereof, it will be apparent to one skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. A method for fabricating a solid-state image sensor comprising the steps of:

forming a well of a first conductivity type in a substrate of a second conductivity type;

forming a plurality of photoelectric conversion regions in the well;

forming a plurality of charge coupled devices in the photoelectric conversion regions;

forming a gate insulating layer over the substrate;

forming a polysilicon layer over the gate insulating layer;

forming a cap insulating layer over the polysilicon layer;

forming a first optical shielding metal layer over the cap insulating layer;

forming a first insulating layer over the first optical shielding metal layer;

patterning the polysilicon layer, cap insulating layer, the first optical shielding metal layer, and the first insulating layer to form polygates;

forming sidewall spacers on sides of the cap insulating layer and the polygate;

forming a second optical shielding metal layer on sides of the first optical shielding metal layer and the sidewall spacers; and removing the first insulating layer.

2. The method according to claim 1, wherein the step of forming the first insulating layer comprises forming a layer of a material selected from a group consisting of an oxide and a nitride.

3. The method according to claim 1, wherein the step of forming the first insulating layer comprises forming a layer of oxide utilizing a high temperature low pressure dielectric.

4. The method according to claim 1, wherein step of forming the first optical shielding metal layer and the step of forming the second optical shielding metal layer utilizes a material selected from a group consisting of tungsten silicide, tungsten titanium and aluminum containing tungsten.

5. The method according to claim 1, wherein the step of forming the first insulating layer comprises forming a layer of high temperature low pressure dielectric, the step of forming the first optical shielding metal layer comprises forming a layer of a material selected from a group consisting of tungsten silicide and tungsten titanium, and the step of forming the second optical shielding metal layer comprises forming a layer of a material selected from a group consisting of tungsten silicide and tungsten titanium.

6. The method according to claim 1, wherein the step of forming the sidewall spacers uses a high temperature low pressure dielectric.

7. The method according to claim 6, wherein the step of forming the sidewall spacers further comprises the steps of:

forming a high temperature low pressure dielectric layer covering the gate insulating layer, the first insulating layer, the first optical shielding metal layer, the cap insulating layer, and the polygates; and etching the high temperature low pressure dielectric layer.

8. The method according to claim 6, wherein the step of forming the sidewall spacers comprises oxidizing the polygates.

9. The method according to claim 8, wherein the polygates are oxidized at a temperature of at least 600° C. and under a pressure of 100–120 Pa.

10. The method according to claim 1, wherein the step of forming the second optical shielding metal layer comprises the steps of:

forming the second optical shielding metal layer over the gate insulating layer, the sidewall spacers and the first insulating layer; and etching the second optical shielding metal layer.

11. The method according to claim 10, wherein the first insulating layer is used as an etch-end point during the step of etching the second optical shielding metal layer.

12. The method according to claim 1, wherein the step of patterning the polysilicon layer, the cap insulating layer, the first optical shielding metal layer, and the first insulating layer forms the polygates over the plurality of charge coupled devices.

13. A method for fabricating a solid-state image sensor comprising the steps of:

forming a charge coupled device in the substrate;

forming a gate insulating layer over the substrate;

forming a polysilicon layer over the gate insulating layer;

forming a cap insulating layer over the polysilicon layer;

forming a first optical shielding metal layer over the cap insulating layer;

forming a first insulating layer over the first optical shielding metal layer;

patterning the polysilicon layer, the cap insulating layer, the first optical shielding metal layer, and the first insulating layer to form a polygate over the charge coupled device;

forming a high temperature low pressure dielectric layer covering the gate insulating layer, the first insulating layer, the first optical shielding metal layer, the cap insulating layer, and the polygate;

etching the high temperature low pressure dielectric layer to form sidewall spacers;

forming the second optical shielding metal layer over the gate insulating layer, the sidewall spacers and the first insulating layer;

patterning the second optical shielding metal layer; and removing the first insulating layer.

14. The method according to claim 13, wherein the first insulating layer is used as an etch-end point during the step of patterning the second optical shielding metal layer.

15. The method according to claim 13, wherein the step of forming the first insulating layer comprises forming a layer of high temperature low pressure dielectric, the step of forming the first optical shielding metal layer comprises forming a layer of a material selected from a group consisting of tungsten silicide and tungsten titanium, and the step of forming the second optical shielding metal layer comprises forming a layer of a material selected from a group consisting of tungsten silicide and tungsten titanium.

16. The method according to claim 13, wherein step of forming the first optical shielding metal layer and the step of forming the second optical shielding metal layer utilizes a material selected from a group consisting of tungsten silicide, tungsten titanium and aluminum containing tungsten.

17. The method according to claim 13, wherein the step of forming the first insulating layer comprises forming a layer of a material selected from a group consisting of an oxide and a nitride.

18. The method according to claim 13, wherein the step of forming the first insulating layer comprises forming a layer of oxide utilizing a high temperature low pressure dielectric.

* * * * *